United States Patent [19]
Gudmundson

[11] Patent Number: 5,164,961
[45] Date of Patent: Nov. 17, 1992

[54] METHOD AND APPARATUS FOR ADAPTING A VITERBI ALGORITHM TO A CHANNEL HAVING VARYING TRANSMISSION PROPERTIES

[75] Inventor: Perols B. O. Gudmundson, Sollentuna, Sweden

[73] Assignee: Telefonaktiebolaget L M Ericsson, Stockholm, Sweden

[21] Appl. No.: 599,896

[22] Filed: Oct. 19, 1990

[30] Foreign Application Priority Data

Oct. 24, 1989 [SE] Sweden ............................... 8903526

[51] Int. Cl.$^5$ ............................................. H03H 7/30
[52] U.S. Cl. ........................................ 375/11; 375/18; 375/99
[58] Field of Search ................. 375/12, 14, 18, 94, 375/96, 101, 39, 99, 11; 371/43, 44, 45

[56] References Cited
U.S. PATENT DOCUMENTS

| | | | |
|---|---|---|---|
| 4,609,907 | 9/1986 | Adler et al. | 375/18 |
| 4,847,871 | 7/1989 | Matsushita et al. | 371/43 |
| 4,862,464 | 8/1989 | Betts et al. | 371/43 |
| 4,965,254 | 2/1990 | Bergmans | 375/94 |
| 5,040,191 | 8/1991 | Forney, Jr. et al. | 375/39 |

OTHER PUBLICATIONS

"Adaptive Maximum Likelihood Sequence Estimation for Digital Signaling in the Presence of Inter Symbol Interferences", by F. R. Magee, Jr. and J. G. Proaks, IEEE Trans. on Info. Theory, Jan. 1973, pp. 120–124.
"Maximum Likelihood Sequence Estimation of Digital Sequences in the Presence of Inner Symbol Interference", by G. D. Forney, Jr. IEEE Trans. of Info Theory, Mar. 1973, pp. 363–378.
"The Viterbi Algorithm", by G. D. Forney, Jr., IEEE Trans. on Info. Theory, Mar. 1973, pp. 268–278.

*Primary Examiner*—Stephen Chin
*Attorney, Agent, or Firm*—Burns, Doane, Swecker & Mathis

[57] ABSTRACT

An equalizer having an adaptive viterbi analyzer and channel estimation circuits connected to each a state of the viterbi analyzer. The equalizer receives a filtered and sampled signal which during its transmission has been subjected to time dispersion. For each state, the estimation circuits each estimate a partial impulse response for the communications channel. The iterative estimation process begins by determining transition error signals between a old and a new state with the aid of a preceding partial impulse response. The estimation circuits estimate the current partial impulse responses for the new state using the part partial impulse responses, the transition vectors, and the transition error signals selected by the viterbi analyzer. The partial impulse responses are used to estimate symbols included in the received signal.

13 Claims, 3 Drawing Sheets

METHOD AND APPARATUS FOR ADAPTING A VITERBI ALGORITHM TO A CHANNEL HAVING VARYING TRANSMISSION PROPERTIES

TECHNICAL FIELD

The present invention relates to a method and apparatus for adapting a viterbi algorithm to a channel having varying transmission properties. The viterbi algorithm is intended to process signals which are transmitted as symbols with a desired number of possible values and which when transmitted over said channel may be subjected to fading, time dispersion and noise. The signals are sampled at desired sampling time-points. The viterbi algorithm has at most a number of states corresponding to the time dispersion of the channel and the number of possible values of the symbols. Other steps of the method include:
  Estimating the impulse response of the channel at one of the sampling time-points with the aid of a desired adaptation procedure;
  estimating symbols according to the viterbi algorithm, including generating a transition vector which corresponds to a state transition from an old state to a new state and selecting a best transition having the smallest metric increase from the old to the new state; and
  estimating the impulse response at the next-following sampling time-point with the aid of the process in dependence on the preceding estimated impulse response.

BACKGROUND OF THE INVENTION

One problem which often occurs when transmitting radio signals over a channel is that a transmitted signal is subjected to multipath propagation and noise. In, for instance, mobile telephony, there is the additional problem that the transmission properties of the channel vary as a result of a mutual shift in the positions of transmitter and receiver. These problems have been solved in time-shared, digital radio transmission systems, in that the signal sequences transmitted in a time slot are made to include a synchronizing sequence and a data sequence. The synchronizing sequence is known to the receiver, and the receiver is able to estimate the transmission properties of the channel, (a channel estimate), with the aid of this sequence. This channel estimate enables the receiver to estimate the symbols of the data sequence which contains the information to be transmitted.

However, in certain instances, it is found insufficient to effect solely one channel estimation with each time slot. In the case of long time slots, in the order of several milliseconds, there is time for the transmitter and the receiver to change their respective positions quite considerably in the duration of the time slot. This means that the transmission properties of the channel can change substantially within the duration of the time slot, so that the estimation of the transmitted symbols carried out by the receiver will be deficient and the transmitted information will contain interferences or disturbances. A radio receiver in which these interferences are partially avoided is described in an article in IEEE Transactions On Information Theory, January 1973, Pages 120-124, F. R. Magee, Jr. and J. G. Proakis: "Adaptive Maximum Likelihood Sequence Estimation for Digital Signaling in the Presence of Intersymbol Interference". The article describes an equalizer which includes a viterbi analyzer having an adaptation filter as a channel estimation circuit. The viterbi analyzer estimates a received symbol, and the estimated symbol is compared with the received signal in the adaption filter. The coefficients of the adaptation filter are adjusted with the aid of an error signal obtained in the comparison, and these coefficients are in turn utilized in the viterbi analyzer to estimate new symbols. The equalizer can utilize as a starting value the channel estimate obtained with the aid of the synchronizing sequence, this channel estimate being updated for each new symbol in the data sequence. The equalizer described in the article overcomes partially those problems which occur with long time slots, but has the drawback of being relatively slow and of providing less satisfactory symbol estimation when channel conditions vary rapidly. This is because the adaptation filter is set with the aid of the symbols estimated in the viterbi analyzer, these symbols being time delayed in relation to the received signals.

SUMMARY OF THE INVENTION

The aforementioned problems encountered with rapidly varying channels are solved in accordance with the present invention by making separate channel estimates for separate states of the viterbi algorithm. Each of the channel estimates is subsequently updated at the sampling time-points of the received signal, in dependence on a selected transition state according to the viterbi algorithm.

BRIEF DESCRIPTION OF THE DRAWINGS

An exemplifying embodiment of the invention will now be described with reference to the accompanying drawings, in which.

DETAILED DESCRIPTION OF THE PREFERRED EMBODIMENTS

Figure 1:
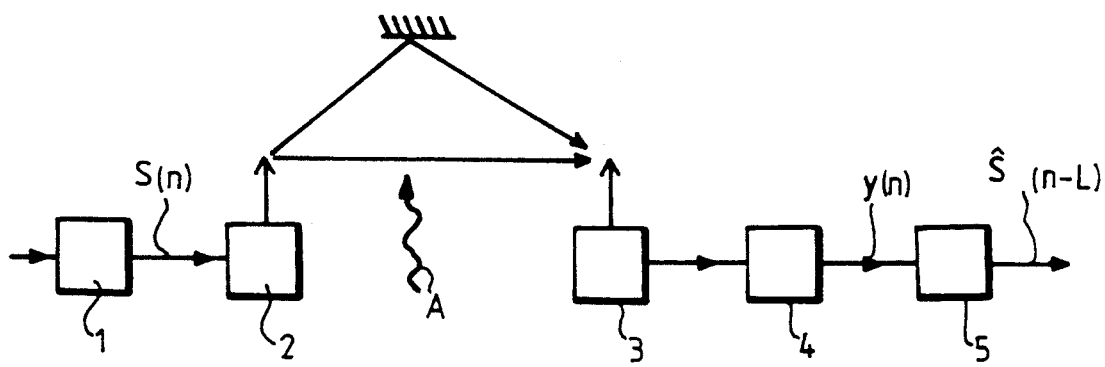
FIG. 1 illustrates schematically a radio transmission system comprising a transmitter and a receiver and an intermediate, disturbed channel.

A radio transmission system for time-shared radio communication is illustrated schematically in FIG. 1. A transmitter has a unit 1 which generates digital symbols S(n). These symbols are digital/analog converted and transmitted from a unit 2 to a receiving unit 3 of a receiver. The received signal is filtered and sampled to produce a received digital signal y(n) which is sent to a channel equalizer 5. This equalizer delivers with a certain time delay estimated symbols $\hat{S}(n-L)$, which constitute an estimation of the transmitted symbols S(n). The designation (n) denotes a sampling timepoint with number n and the designation (n−L) denotes that the estimated symbols are delayed with an L-number sampling intervals. The double signal paths shown in FIG. 1 indicate that the channel between the units 2 and 3 subjects the transmitted signal to time dispersion. Shown in FIG. 1 is a signal A which indicates a disturbance signal on the same channel as that used between the units 2 and 3. Fading and noise also disturb the transmission. As before mentioned, the radio transmission system is time-shared with separate time slots 1 to N according to FIG. 2, in which T signifies time. A signal sequence SS, which includes a synchronizing sequence SO and a data sequence DO with the information to be transmitted, can be transmitted in each time slot f. The signal sequence SS contains binary signals, although the aforesaid symbols S(n) are coded according, for instance, to the QPSK-code as illustrated in FIG. 3. In a complex number plan, with the axes designated I and Q, the four possible values of the symbols S(n) are marked one in each quadrant with the binary numbers 00, 01, 10 or 11.

Figure 4:
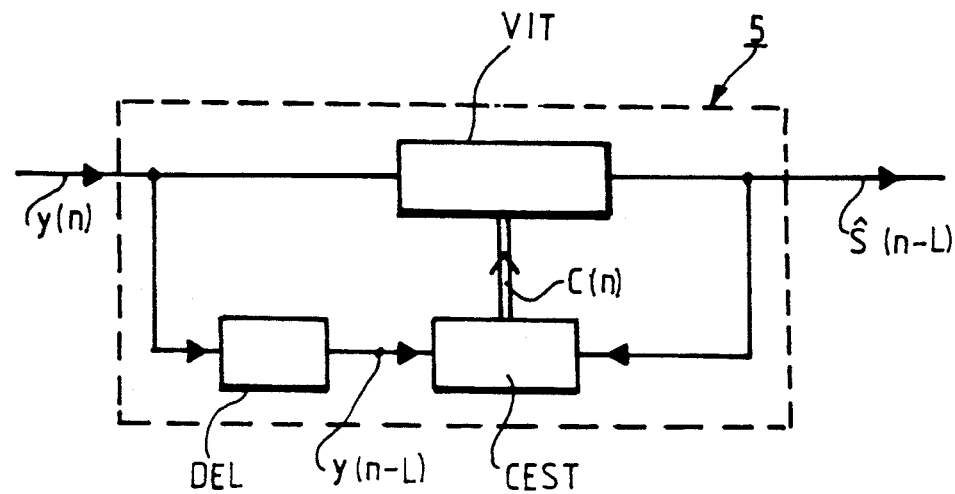
FIG. 4 is a block schematic of a viterbi equalizer.

The channel equalizer 5 in FIG. 1 which processes the signal y(n) may have the form of the known viterbi equalizer described in the aforesaid article by F. R. Magee, Jr. and J. G. Proakis. The equalizer 5, which is illustrated schematically in FIG. 4, has a viterbi analyzer VIT, an adaptive channel estimation filter CEST and a delay circuit DEL. The viterbi analyzer VIT receives the signal y(n) and delivers the symbol Ŝ(n−L) which are estimated in a known manner with the delay of L sampling steps. The channel estimation filter CEST receives the estimated symbols Ŝ(n−L) and signals y(n−L), which are the received signals y(n) delayed L sampling steps in the delay circuit DEL. The channel estimation filter CEST compares the signal y(n−L) with the estimated symbols Ŝ(n−L) and delivers to the viterbi analyzer VIT an estimated impulse response C(n) for the channel. Alternatively, a preliminary decision from the viterbi analyzer VIT can be used instead of the estimated symbols Ŝ(n−L) There is obtained in this way a delay which is shorter than the L sampling intervals. Estimation of the impulse response C(n) will be described in more detail with reference to FIG. 5. The viterbi equalizer 5 utilizes the synchronizing sequence SO to create a starting value for the impulse response C(n), which is later updated at each new sampling timepoint.

Figure 5:
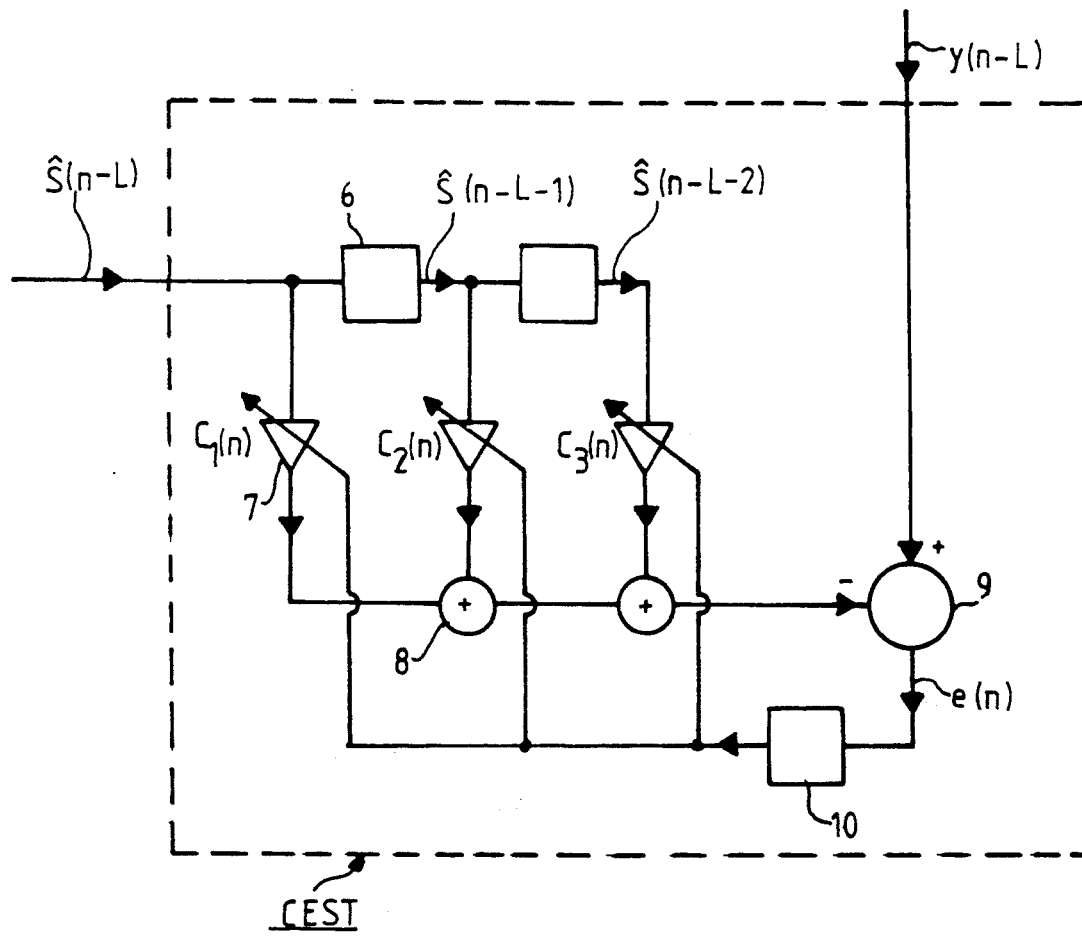
FIG. 5 is a circuit diagramme of a channel estimating filter.

The known channel estimating filter CEST, illustrated in more detail in FIG. 5, has delay elements 6, adjustable coefficients 7, summators 8, a difference forming circuit 9 and an adaptation circuit 10 which processes a desired adaptation algorithm. The number K of coefficients 7 depends on the extent of the time dispersion that the channel has, expressed in a number of sampling intervals, and in the case of the illustrated embodiment K=3. The estimated symbols Ŝ(n−L) are delayed stepwise one sampling timepoint in the delay elements 6 to produce symbols Ŝ(n−L−1) up to Ŝ(n−L−K+1), which are multiplied with constants $c_1$. . . , $c_k$. Subsequent to stepwise addition in the summators 8 to produce a signal ŷ(n−L), there is formed an error signal e(n) which is the difference between the signal ŷ(n−L) and the delayed received signal y(n−L). The adaptation circuit 10 receives the error signal e(n) and controls the coefficients 7 in a manner to minimize the error signal. The constants $c_1(n)$. . . , $c_K(n)$ constitute the aforesaid estimated impulse response C(n). This can be described as a channel vector $C(n)=(c_1(n),\ldots,c_K(n))^T$ and correspondingly a signal vector can be defined as $S(n)=(s(n-L),\ldots,s(n-L-K+1))^T$. The error signal e(n) can now be expressed, with the aid of these vectors, as $e(n)=y(n-L)-C^T(n)\cdot S(n)$. When, for instance, the desired adaptation algorithm is an LMS algorithm, Least Mean Square, the channel estimate is calculated iteratively according to $C(n)=C(n-1)+\mu S^*(n)\cdot e(n)$. Other adaptation algorithms, for instance RLS, Recursive Least Square, can also be applied. It will be seen in conjunction with the aforegoing that the index T is a transposition, the index * relates to a complex conjugation and $\mu$ is a constant.

In order to explain the invention, a number of quantities which refer to the viterbi algorithm will now be defined. For a closer description of this algorithm, reference is made to IEEE Transactions of Information Theory, May 1972, Vol. TI 18, No. 3, Pages 366-378, G. D. Forney, Jr.: "Maximum Likelihood Sequence Estimation of Digital Sequences in the Presence of Intersymbol Interference" and to Proceedings of IEEE, March 1973, G. D. Forney, Jr.: "The Viterbi Algorithm". A viterbi analyzer is characterized, among other things, by the number of states possessed by the analyzer. The number of states of the viterbi analyzer VIT utilized in the channel equalizer 5 depends on the time dispersion of the channel expressed in the number of sampling intervals and designated K above. The number of states also depends on the number of possible values B of the transmitted symbols S(n). In the exemplifying embodiment of FIG. 4, B=4. The number of states M of the viterbi analyzer VIT can be expressed by the relationship $M=B^{K-1}$ and according to the illustrated example M=16. A symbol vector having K−1 symbols is allotted to each of said states, such that a symbol vector $Q_i=(q_{i,1},\ldots,q_{i,K-1})^T$, which describes the state i, is, in general, allotted to the state i. Correspondingly, the symbol vector $Q_j=(q_{j,1},\ldots,q_{j,k-1})^T$ is allotted to a state j. Thus, the first K−2 elements of the symbol vector $Q_i$ are identical with the last K−2 elements of the symbol vector $Q_j$. For the transition from the state i, which is an old state, to the state j, which is a new state, there is defined a transition vector $S_{ij}=(s_{ij}^1,\ldots,s_{ij}^K)$ with symbols which are K in number. For the first element in the vector $S_{ij}$, $s_{ij}^1$ will equal $q_{j,1}$ and for the last element $s^K_{ij}$ will equal $q_{i,K-1}$. The intermediate elements are the elements which are common to the vectors $Q_i$ and $Q_j$. For the state transition from the old state i to the new state j at the sampling timepoint n, the viterbi equalizer 5 calculates, in a known manner, a transition error signal $e_{ij}(n)$ which, with the aid of the above inserted transition vector, can be expressed as $e_{ij}(n)=y(n)-C^T(n)\cdot S_{ij}$. With the aid of the transition error signal $e_{ij}(n)$, there is calculated a metric value $M_j(n)$ for the new state j at the sampling timepoint n as the least of $M_j(n)=M_1(n-1)+e^2_{1j}(n)$. In this case, 1 assumes all the values from 1 to B, where B is the number of possible values of a symbol, as before mentioned. The viterbi analyzer VIT selects in this way, in a known manner, the path to each state which gives the smallest metric.

The present invention is based on the concept of utilizing a viterbi analyzer according to the above and forming a separate part impulse response of the channel for each state in the viterbi algorithm. This avoids the time delay of L sampling intervals occurring with the known viterbi equalizer 5.

Figure 6:
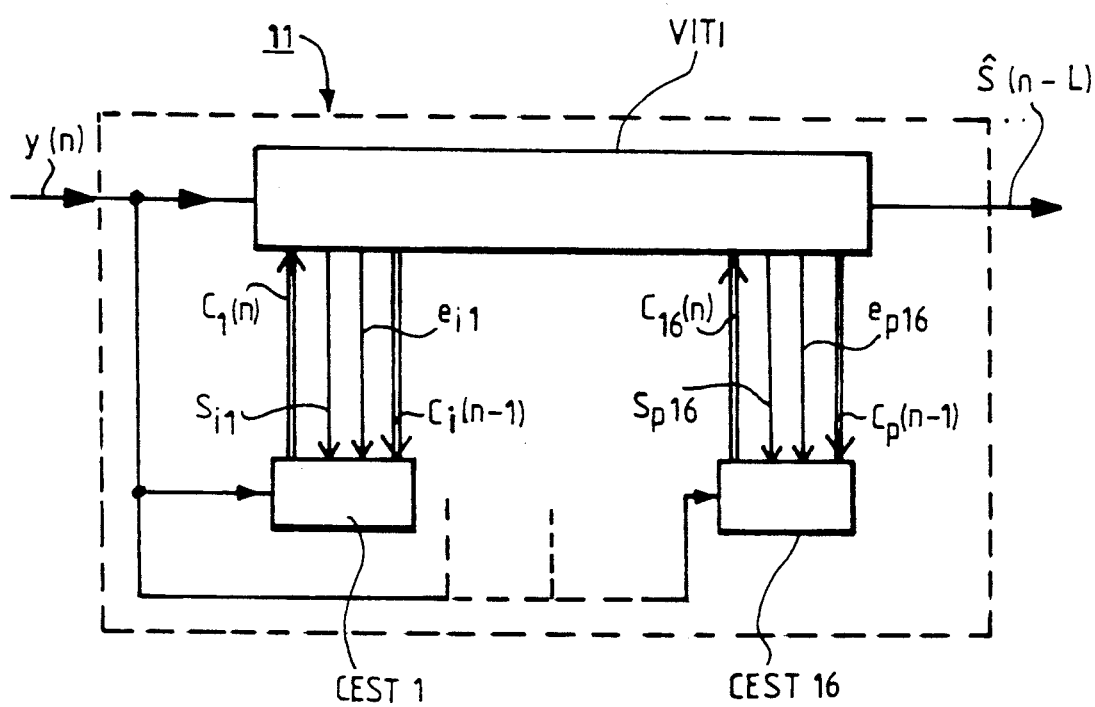
FIG. 6 is a block schematic of a viterbi equalizer according to the present invention.

An inventive viterbi equalizer 11 is illustrated in FIG. 6. The equalizer includes a viterbi analyzer VIT1 having a number of states M=16 according to the example above, and a channel estimating device which includes channel estimating circuits CEST1 . . . , CEST16. The viterbi analyzer VIT1 receives the signal y(n) at the sampling timepoint D and emits the estimated symbol Ŝ(n−L) the number L sampling intervals later in the same manner as that described for the viterbi analyzer VIT. All of the channel estimating circuits are connected to the viterbi analyzer VIT1 and an estimation of one of the part impulse responses is made in each of the channel estimating circuits. The part impulse response $C_j(n)$ for the new state j at the sampling timepoint n is calculated iteratively from the part impulse response $C_i(n-1)$ for the old state i at the preceding sampling timepoint $(n-1)$. $C_i(n-1)$ is the channel estimate which pertains to the path selected by VIT1 at the state transition of i to j. $C_j(n)$ is calculated with the aid of the transition error signal $e_{ij}(n)$, which is calculated in accordance with the relationship $e_{ij}(n) = y(n) - C^T_i(n-1)S_{ij}$. This calculation corresponds to the earlier shown known calculation of the transition error signal $e_{ij}(n)$, although, according to the invention, the calculation is effected with the aid of the part impulse response $C_i(n-1)$. The part impulse response $C_j(n)$ for the new state j at the sampling timepoint is calculated in the j:th channel estimating circuit in accordance with a desired algorithm, for instance the aforesaid LMS-algorithm, which gives $C_j(n) = C_i(n-1) + \mu S^*_{ij} e_{ij}(n)$. FIG. 6 illustrates the channel estimation for the first and the last state 1 and 16 respectively. At the sampling timepoint, the viterbi analyzer VIT1 selects a transition from the state i to the state 1 and delivers the transition vector $S_{i1}$, the transition error signal $e_{i1}$ and the old part impulse response $C_i(n-1)$ to the channel estimating circuit CEST1. This circuit calculates the new part impulse response $C_1(n)$ which is delivered to VIT1 for use at the next timepoint $(n+1)$ in the viterbi detection and for continued iterative calculation of the part impulse responses. In the same way, the viterbi analyzer VIT1 selects a transition from the state p to the state 16 and delivers the transition vector $S_{p16}$, the transition error signal $e_{p16}$ and the old part impulse response $C_p(n-1)$ to CEST16. The new part impulse response $C_{16}(n)$ is calculated and delivered to VIT1.

Figure 2:
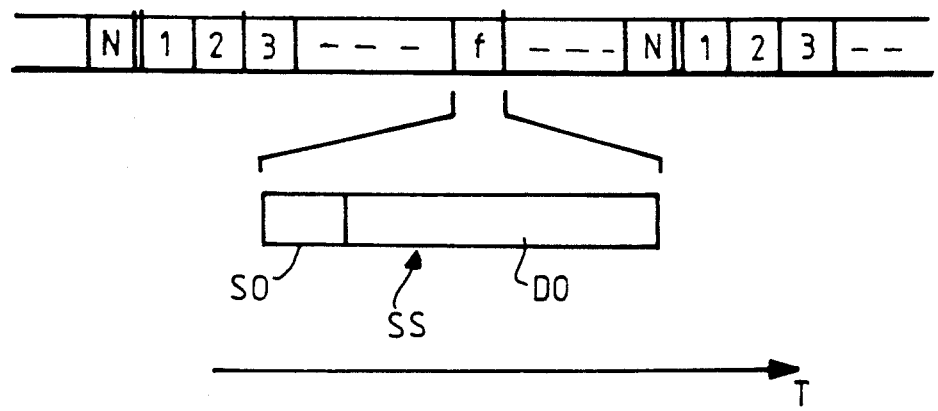
FIG. 2 illustrates time slots of a time-shared transmission system, and a signal sequence for a time slot.
Figure 3:
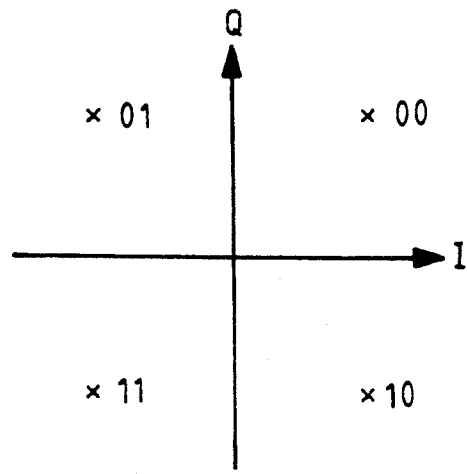
FIG. 3 is a diagramme showing separate symbol values.

There can be used as a starting point for the aforedescribed iterative calculation of the part impulse response $C_j(n)$ during the data sequence DO an impulse response which is calculated in a known manner with the aid of the synchronizing sequence SO in FIG. 2. It is also possible to utilize the synchronizing sequence SO as a training sequence before the data sequence DO. The part impulse response $C_j(n)$ is calculated iteratively during the synchronizing sequence with the aid of the synchronizing sequence SO, departing from preselected starting values, e.g. from $C_i=0$. The iteration then continues for the data sequence DO.

As will be evident from the aforegoing, the channel estimate $C_j(n)$ is calculated in the channel estimating circuits CEST1 . . . , CEST16. However, no error calculation corresponding to the calculation of the error signal e(n) in the channel estimating filter CEST is carried out in the channel estimating circuits CEST1 . . . , CEST16. The transition error signals $e_{ij}(n)$ are calculated in the viterbi analyzer VIT1, as is also the transition vector $S_{ij}$. The equalizer 11 of the aforedescribed embodiment of the invention has a channel estimating circuit for each state of the viterbi analyzer. In the case of viterbi analyzers which have many states, the number of states is reduced in order to simplify the calculating circuits. This reduction also results in a reduction in the number of part impulse responses $C_j(n)$ and the number of channel estimating circuits. With such a reduction, it is possible, in accordance with the invention, to utilize solely two channel estimating circuits with two separate part impulse responses.

The aforedescribed viterbi equalizer 11 functions in accordance with an algorithm which is adapted to the channel according to an inventive method described herebelow. When transmitting signals over the channel, the transmitter sends the digital symbols S(n) in the sequences SS shown in FIG. 2. The sequences SS include at least the synchronizing sequence SO and the data sequence DO and each symbol S(n) has one of the B number of possible values, where according to the example illustrated in FIG. 3 B=4. As before mentioned, the transmitted signals are subjected to time dispersion through number of sampling intervals K and according to the above example K=3. The receiver effects a filtering and sampling process, so as to obtain the received digital signal y(n). The viterbi algorithm has a number of states M which is $M = B^{K-1}$. According to the example M equals 16. The method is iterative and comprises an estimation of the separate part impulse responses $C_j(n)$ for separate states j of the viterbi algorithm at the indicated sampling timepoint n. The estimation includes a calculation of the transition error signals $e_{ij}(n)$ from the old state i to the new state j according to the viterbi algorithm. As mentioned above, this calculation can be expressed by the relationship $e_{ij}(n) = y(n) - C^T_i(n-1)S_{ij}$, where $S_{ij}$ is the aforedescribed transition vector and $C_i(n-1)$ is the part impulse response for the old state i at the sampling timepoint $n-1$ one step before the indicated sampling timepoint D. The state transition from the old state i to the new state j which gives the smallest metric increase according to the viterbi algorithm is selected. The new part impulse response $C_j(n)$ is estimated in accordance with the desired adaptation algorithm, with the aid of the selected state transition i to j and the transition error signal $e_{ij}(n)$. According to the example, the LMS-algorithm is used to calculate the part impulse response according to the relationship $C_j(n) = C_i(n-1) + \mu S^*_{ij} e_{ij}(n)$, where $\mu$ is constant and $S^*_{ij}$ is the complex conjugated transition vector in accordance with the aforegoing. Impulse responses calculated in a traditional manner, with the aid of the synchronizing sequence SO, can be used as a starting value for the iterative estimation of the part impulse response $C_j(n)$. According to one alternative, the synchronizing sequence SO may constitute a training sequence for calculating starting values in accordance with the inventive method, with a starting point from an appropriate starting value, e.g. $C_i=0$, selected by an operator. The starting value for the training sequence may also comprise the impulse response calculated in a traditional manner.

The inventive apparatus illustrated in FIG. 6 and intended for carrying out the aforedescribed inventive method includes the separate calculating circuits CEST1 . . . , CEST16. These circuits function to carry out parallel estimations of the part impulse responses $C_j(n)$ for the separate states of the viterbi algorithm. It is possible, according to the invention, to use solely one calculating circuit for calculating part impulse responses $C_j(n)$ sequentially. The subsequently calculated values are stored in memory units for use in the viterbi algorithm, partly in the estimation of the symbols $\hat{S}(n-L)$ and partly in the iterative calculation of impulse responses $C_j(n)$. The calculating circuit may be programmable.

The invention has been described in the above exemplifying embodiment with reference to a time-shared radio communication system. The invention, however, can be practiced in other applications in which a viterbi analyzer receives, via a transmission medium, a signal which may have been subjected to different kinds of interference. For instance, the invention can be applied in systems other than time-shared systems and in other transmission medium than air or vacuum.

I claim:

1. A method of adapting a viterbi algorithm to a channel having varying transmission properties, which algorithm is intended to process signals which are transmitted as symbols with a desired number of possible values and which when transmitted over said channel may be subjected to fading, time dispersion and noise, said signals being sampled at desired sampling time-points and the viterbi algorithm having at most a number of states corresponding to the time dispersion of the channel and the number of possible values of the symbols, said method being iterative and comprising the following method steps:

estimating the impulse response of the channel at one of the sampling time-points with the aid of a desired adaptation algorithm;

estimating symbols according to the viterbi algorithm, including generating a transition vector which corresponds to a state transition from an old state to a new state and the selection of a best transition having the smallest metric increase from the old to the new state; and estimating the impulse response at the next-following sampling time-point with the aid of the adaptation algorithm in dependence on the preceding estimated impulse response wherein the estimated impulse response of the channel includes at least two part impulse response ($C_1(n), \ldots, C_M(n)$) for separate states (1-M) in the viterbi algorithm, said part impulse responses each being estimated by the following method steps:

for a received signal ($y(n)$) received at an indicated sampling time-point (n), calculating transition error signals ($e_{ij}(n)$) in accordance with the viterbi algorithm for the said state transition (i to j) in dependence on the received signal ($y(n)$), the said transition vector ($S_{ij}$) for the state transition (i to j) and the part impulse response ($C_i(n-1)$) for said old state (i) at a preceding sampling time-point (n−1) one step before the indicated sampling time-point (n);

selecting, in accordance with the viterbi algorithm, the best state transition (i to j) with the associated smallest one of the transition error signals ($e_{ij}(n)$); and estimating, in accordance with the adaptation algorithm (LMS) a renewed part impulse response ($C_j(n)$) for the new state (j) at the indicated sampling time-point (n) in dependence on the part impulse response ($C_i(n-1)$) for the old state (i) at the preceding sampling time-point (n−1), the selected smallest transition error signal ($c_{ij}(n)$) and the transition vector ($S_{ij}$) for the selected best state transition (i to j), wherein the part impulse response ($C_i(n-1)$) for the old state (i) pertains to the selected transition state.

2. A method according to claim 1, wherein the part impulse response ($C_1(n), \ldots, C_M(n)$) are estimated in parallel with one another.

3. A method according to claim 1, wherein the part impulse responses ($C_1(n), \ldots, C_M(n)$) are estimated sequentially.

4. A method according to claim 1, in which the signals are transmitted in sequences which include at least one synchronizing sequence and a data sequence, wherein the synchronizing sequence (SO) forms a training sequence during which the part impulse responses ($C_1(n), \ldots, C_M(n)$) are estimated so as to constitute the starting values for estimating the part impulse responses during the data sequence (DO).

5. A method according to claim 1, in which the signals are transmitted in sequences which include at least one synchronizing sequence and old data sequence and a first impulse response for the channel is estimated with the aid of the synchronizing sequence, wherein said first impulse response forms a starting value for estimating the part impulse responses ($C_1(n), \ldots, C_M(n)$) during the data sequence (DO).

6. An equalizer for iteratively adapting a viterbi analyzer to a communications channel having shifting transmission properties, comprising: p1 means for receiving a signal and sampling said signal over a sampling period, said signal transmitted as a plurality of symbols, and said symbols having a desired number of possible values;

means for estimating said symbols including:
means for generating a transition vector corresponding to a state transition from an old state corresponding to said signal being sampled over a first sampling period to a new state corresponding to said signal being sampled over second sampling period after said first sampling period, and means for selecting an optimum state transition having a smallest metric increase from said old state to said new state; and adaptive channel filter means for determining an impulse response estimate for a successive sampling period of said communications channel depending on a preceding impulse response estimate determined at a preceding sampling period, including:

means for estimating partial impulse responses for each state;

means for determining a state transition error depending on said received signal, said transition vector, and a past partial impulse response for said old state at a sampling period immediately preceding a current sampling period;

means for selecting a state transition having a smallest state transition error; and means for estimating a partial impulse response for a current state at said current sampling period dependent upon said past partial impulse response for said old state at said preceding sampling time period, said selected, smallest state transition error, and said transition vector for said selected state transition.

7. An apparatus according to claim 6, wherein said adaptive channel filter means further comprises:

channel estimating circuits individually connected with a respective state for estimating said partial impulse responses in parallel.

8. An apparatus according to claim 6, wherein said adaptive channel filter means estimates said partial impulse responses sequentially.

9. A method for iteratively adapting a symbol estimation procedure to a communications channel having shifting transmission properties, comprising:

receiving a signal and sampling said signal over a sampling period, said signal transmitted as a plurality of symbols, and said symbols having a desired number of possible values;

estimating said symbols by:

generating a transition vector corresponding to a state transition from an old state corresponding to said signal being sampled over a first sampling period to a new state corresponding to said signal being sampled over a second sampling period after said first sampling period, and selecting an optimum state transition having a smallest metric increase from said old state to said new state;

determining an impulse response estimate for a successive sampling period of said communications channel depending upon a preceding impulse response estimate determined at a preceding sampling period, said determining step including:

estimating partial impulse responses for each state;

determining a state transition error depending upon said received signal, said transition vector, and a past partial impulse response for said old state at a sampling period immediately preceding a current sampling period;

selecting a state transition having a smallest state transition error; and estimating a partial impulse response for a current state at said current sampling period dependent upon said partial impulse response for said old state at said preceding sampling time period, said selective, smallest state transition error, and said transition vector for said selected state transition.

10. A method according to claim 9, wherein said partial impulse responses are estimated in parallel.

11. A method according to claim 9, wherein said partial impulse responses are estimated sequentially.

12. A method according to claim 9, wherein plural signals are transmitted in sequences which include at least one synchronizing sequence and a data sequence, said synchronizing sequence forming a training sequence during which said partial impulse responses are estimated as starting values for estimating said partial impulse responses during said data sequence.

13. A method according to claim 9, wherein plural signals are transmitted in sequences which include at least one synchronizing sequence and one data sequence such that a first impulse response for said channel is estimated based on said synchronizing sequence, said first impulse response forming a starting value for estimating said partial impulse responses during said data sequence.

* * * * *